(12) United States Patent
Kito et al.

(10) Patent No.: US 10,575,451 B2
(45) Date of Patent: Feb. 25, 2020

(54) INSERTION COMPONENT POSITIONING INSPECTION METHOD AND INSERTION COMPONENT MOUNTING METHOD, AND INSERTION COMPONENT POSITIONING INSPECTION DEVICE AND INSERTION COMPONENT MOUNTING DEVICE

(71) Applicant: FUJI CORPORATION, Chiryu-shi (JP)

(72) Inventors: Shuichiro Kito, Toyota (JP); Hiroshi Oike, Chiryu (JP); Takahiro Kobayashi, Chiryu (JP); Yoichi Murano, Toyoake (JP)

(73) Assignee: FUJI CORPORATION, Chiryu-shi (JP)

( * ) Notice: Subject to any disclaimer, the term of this patent is extended or adjusted under 35 U.S.C. 154(b) by 92 days.

(21) Appl. No.: 15/735,767

(22) PCT Filed: Jun. 16, 2015

(86) PCT No.: PCT/JP2015/067241
§ 371 (c)(1),
(2) Date: Dec. 12, 2017

(87) PCT Pub. No.: WO2016/203534
PCT Pub. Date: Dec. 22, 2016

(65) Prior Publication Data
US 2018/0177087 A1 Jun. 21, 2018

(51) Int. Cl.
*H05K 13/04* (2006.01)
*H05K 13/08* (2006.01)
(Continued)

(52) U.S. Cl.
CPC ..... *H05K 13/0413* (2013.01); *H05K 13/0813* (2018.08); *H05K 13/0815* (2018.08)

(58) Field of Classification Search
CPC ............. H05K 13/0069; H05K 13/022; H05K 13/0413; H05K 13/08; H05K 13/0813; H05K 13/0815
See application file for complete search history.

(56) References Cited

U.S. PATENT DOCUMENTS

| | | | |
|---|---|---|---|
| 6,445,201 B1 * | 9/2002 | Simizu | G01R 1/0483 324/750.02 |
| 6,608,320 B1 * | 8/2003 | Skunes | G01B 11/024 250/559.19 |

(Continued)

FOREIGN PATENT DOCUMENTS

| | | |
|---|---|---|
| JP | 63-172500 A | 7/1988 |
| JP | 5-251894 A | 9/1993 |

(Continued)

OTHER PUBLICATIONS

International Search Report dated Aug. 25, 2015 in PCT/JP2015/067241 filed Jun. 16, 2015.

*Primary Examiner* — Kenneth M Lo
*Assistant Examiner* — Chad G Erdman
(74) *Attorney, Agent, or Firm* — Oblon, McClelland, Maier & Neustadt, L.L.P.

(57) ABSTRACT

When determining whether an insertion component provided with a positioning-use protruding section and a surface-mounting-use electrode section can be mounted onto a circuit board provided with a positioning hole into which the positioning-use protruding section is inserted and a land for connecting the surface-mounting-use electrode section, an image is captured of the positioning-use protruding sections and the surface-mounting-use electrode sections of the insertion component either separately or simultaneously by a component imaging camera, and the positions of the positioning-use protruding sections and the positions of the surface-mounting-use electrode sections are recognized by processing the captured image. The position deviation amount between the surface-mounting-use electrode sections of the insertion component and the lands of the circuit board is calculated, and by determining whether the position deviation amount is within a tolerance range, it is deter- (Continued)

mined whether the insertion component can be mounted on the circuit board.

9 Claims, 8 Drawing Sheets

(51) Int. Cl.
*H05K 13/00* (2006.01)
*H05K 13/02* (2006.01)

(56) References Cited

U.S. PATENT DOCUMENTS

| | | | | |
|---|---|---|---|---|
| 2006/0018531 | A1* | 1/2006 | Murakami | G01N 21/8851 |
| | | | | 382/145 |
| 2007/0054514 | A1* | 3/2007 | Long | G01R 1/0433 |
| | | | | 439/70 |
| 2010/0189340 | A1* | 7/2010 | Ueda | G01N 21/956 |
| | | | | 382/145 |
| 2014/0298649 | A1* | 10/2014 | Ishitani | H05K 13/0408 |
| | | | | 29/837 |

FOREIGN PATENT DOCUMENTS

| | | |
|---|---|---|
| JP | 5-343897 A | 12/1993 |
| JP | 8-69838 A | 3/1996 |
| JP | 9-35782 A | 2/1997 |
| JP | 2013-179190 A | 9/2013 |

* cited by examiner (c) Left side view (a) Front view (b) Bottom view

INSERTION COMPONENT POSITIONING INSPECTION METHOD AND INSERTION COMPONENT MOUNTING METHOD, AND INSERTION COMPONENT POSITIONING INSPECTION DEVICE AND INSERTION COMPONENT MOUNTING DEVICE

TECHNICAL FIELD

The present disclosure relates to an insertion component positioning inspection method and an insertion component mounting method, and an insertion component positioning inspection device and an insertion component mounting device for determining whether an insertion component provided with a positioning-use protruding section and a surface-mounting-use electrode section can be mounted onto a circuit board provided with a positioning hole into which the positioning-use protruding section is inserted and a land for connecting the surface-mounting-use electrode section.

BACKGROUND ART

For example, as disclosed in patent literature 1 (JP-A-H9-35782), and patent literature 2 (JP-A-H8-69838), there are devices configured to, for the purpose of improving the connection strength of a component such as a connector that is mounted on a circuit board, position a component based on positioning holes provided at multiple locations on a circuit board by inserting positioning-use protruding sections that protrude downwards and that are provided at multiple locations on the component into positioning holes formed at multiple locations in the circuit board, align surface-mounting-use electrode sections of the component (the tip sections of leads, bumps, or the like) with lands of the circuit board, and perform soldering by reflow. Hereinafter, a component provided with a positioning-use protruding section is referred to as an "insertion component."

Generally, when using a component mounter to mount insertion components on a circuit board, insertion components supplied by a component supply device such as a tray feeder are picked up by a mounting head of the component mounter, and while being moved above the circuit board, an image of the insertion component is captured from below by a component imaging camera, and by processing the captured image, the position of positioning-use protruding sections of the insertion component are recognized, and based on those results, deviation in the mounting position and angle of the insertion component is corrected, and the positioning-use protruding sections of the insertion component are inserted into positioning holes of the circuit board, such that the insertion component is positioned based on multiple positioning holes of the circuit board, and the surface-mounting-use electrode sections of the insertion component are aligned with the lands of the circuit board, with reflow soldering then being performed. Here, with a method for checking the position of the positioning holes of the circuit board, reference marks of a circuit board clamped at a component mounting position inside the component mounter are captured by a mark imaging camera, and by performing image recognition of the positions of the reference marks of the circuit board, the positions of the positioning holes are determined using specification data (position data of the positioning holes, lands, and the like based on the positions of the reference marks) supplied from the manufacturer of the circuit board based on the positions of the reference marks.

CITATION LIST

Patent Literature

Patent literature 1: JP-A-H9-35782
Patent literature 2: JP-A-H8-69838

SUMMARY

However, depending on manufacturing variations of the insertion components, or deformation of the surface-mounting-use electrode sections such as leads, it is possible that variance exists in the positional relationship between the positioning-use protruding sections of the insertion component and the surface-mounting-use electrode sections. And, in the above conventional insertion component mounting methods, because the insertion component is positioned based on the position of the positioning holes of the circuit board, and the surface-mounting-use electrode sections of the insertion component are aligned with the lands of the circuit board by image recognition being performed of the positions of the positioning-use protruding sections of the circuit board, and the positioning-use protruding sections of the insertion component being inserted into the positioning holes of the circuit board, during mounting, there is a possibility that the surface-mounting-use electrode sections may deviate in position from the lands of the circuit board depending on manufacturing variations of the insertion components, or deformation of the surface-mounting-use electrode sections such as leads, and this may cause connection defects between the surface-mounting-use electrode sections of the insertion component and the lands of the circuit board, and a decrease in connection reliability.

To solve the above problems, the present disclosure is an insertion component positioning inspection method and insertion component positioning inspection device for determining whether an insertion component provided with a positioning-use protruding section and a surface-mounting-use electrode section can be inserted into a circuit board provided with a positioning hole into which the positioning-use protruding section is inserted and a land for connecting to the surface-mounting-use electrode section, the insertion component positioning inspection method and device including: capturing an image of the positioning-use protruding section and the surface-mounting-use electrode section of the insertion component either separately or simultaneously using a component imaging camera and processing the captured image to recognize positions of the positioning-use protruding section and the surface-mounting-use electrode section; and calculating a position deviation amount between the surface-mounting-use electrode section of the insertion component and the land of the circuit board based on an assumption that the positioning-use protruding section of the insertion component is inserted into the positioning hole of the circuit board, and determining whether the insertion component can be mounted on the circuit board by determining whether the position deviation amount is within a tolerance range.

Accordingly, it is possible to perform mounting of insertion components on a circuit board only in a case in which a position deviation amount between a surface-mounting-use electrode section and a land when a positioning-use protruding section of the insertion component is inserted into a positioning hole of the circuit is determined to be within a tolerance range before mounting the insertion component on the circuit board, thus preventing connection defects between the surface-mounting-use electrode section of the insertion component and the land of the circuit board and improving connection reliability.

With the present disclosure, when calculating the position deviation amount between the surface-mounting use electrode section and the land, specification data (position data such as the positions of lands or positioning holes based on reference marks of the circuit board) provided by a manufacturer of the circuit board may be used as data of the position of the positioning hole and the position of the land of the circuit board. In this case, only image recognition of the position of reference marks of the circuit needs to be performed, and because this image recognition of the position of the reference marks is performed before component mounting to determine the position of the circuit board inside the component mounter at the component mounting position, that image processing result can be used as is, and it is not necessary to perform additional image recognition processing.

Also, the position of the positioning holes and the position of the land used when calculating the position deviation amount may be recognized by processing the image captured by the board imaging camera either separately or simultaneously of the positioning hole and the land of the circuit board. Accordingly, even in a case in which there is variance in the positions of the positioning holes and the lands depending on manufacturing variance of the circuit board, because the variance in the position of the positioning holes and the position of the lands can be image recognized, influence of the variance of the position of the positioning holes and the lands can be eliminated, and it is possible to determine with good accuracy whether the position deviation amount between the surface-mounting-use electrode section and the land when the positioning-use protruding sections of the insertion component are inserted into the positioning holes of the circuit board is within the tolerance range.

Generally, the internal diameter of positioning holes of a circuit board is formed with a dimension slightly larger than the external diameter of the positioning-use protruding section of the insertion component such that the positioning-use protruding section of the insertion component can be easily inserted, therefore, a gap (clearance) forms between the two when the positioning-use protruding section of the insertion component is inserted into the positioning hole of the circuit board, and it is possible to shift the positioning-use protruding section within the range of that gap. When ignoring the influence of this gap, it is fine to perform positioning of the insertion component such that the center of the positioning-use protruding section is aligned with the center of the positioning hole.

However, when considering the influence of the gap, an external diameter of the positioning-use protruding section may be recognized by processing the image captured by the component imaging camera including the positioning-use protruding section, an internal diameter of the positioning hole may be recognized by processing the image captured by the board imaging camera including the positioning hole, and, based on the recognition results of the external diameter of the positioning-use protruding section and the internal diameter of the positioning hole, based on an assumption that the positioning-use protruding section of the insertion component is inserted into the positioning hole of the circuit board, a minimum value of the position deviation amount between the surface-mounting-use electrode section of the insertion component and the land of the circuit board may be searched for by shifting the positioning-use protruding section within a range of a distance between the positioning-use protruding section and the positioning hole, whether the insertion component can be mounted on the circuit board may be determined by determining whether the minimum value of the position deviation amount is within a tolerance range, and in a case of determining that mounting is possible, a position correction amount of the insertion component for which the position deviation amount is the minimum value may be calculated.

Accordingly, because, based on an assumption that the positioning-use protruding section is inserted into the positioning hole, a minimum value of the position deviation amount between the surface-mounting-use electrode section of the insertion component and the land of the circuit board is searched for by shifting the positioning-use protruding section within a range of a distance between the positioning-use protruding section and the positioning hole, and whether the insertion component can be mounted on the circuit board is determined by determining whether the minimum value of the position deviation amount is within a tolerance range, the gap between the positioning-use protruding section and the positioning hole is used effectively to minimize the position deviation amount between the surface-mounting-use electrode section of the insertion component and the land of the circuit board, and it is possible to determine whether the insertion component can be mounted on the circuit board by determining whether the minimum value of the position deviation amount is within a tolerance range, and to determine with high accuracy taking into account the gap between the positioning-use protruding section and the positioning hole. Further, if mounting is determined to be possible, because a position correction amount of the insertion component for which the position deviation amount between the surface-mounting-use electrode section and the land is minimized is calculated, when mounting the insertion component on the circuit board, it is possible to mount the insertion component on the circuit board minimizing the position deviation amount between the surface-mounting-use electrode section and the land, thus improving the connection reliability between the surface-mounting-use electrode section and the land.

When applying the present disclosure to a component mounter, in a state with the insertion component held by a mounting head, it may be determined whether the insertion component can be mounted on a circuit board using the above insertion component positioning inspection method, and insertion components for which mounting is determined to be impossible may be discarded to a specified discard location or collection location, and insertion components for which mounting is determined to be possible may be mounted on the circuit board.

DESCRIPTION OF EMBODIMENTS

A first, second, and third embodiment as three modes for carrying out the disclosure are described below.

First Embodiment

A first embodiment of the present disclosure applied to a modular component mounting system will be described using FIGS. 1 to 8. First, the configuration of the modular component mounting system will be described using FIGS. 1 to 3.

Figure 5:
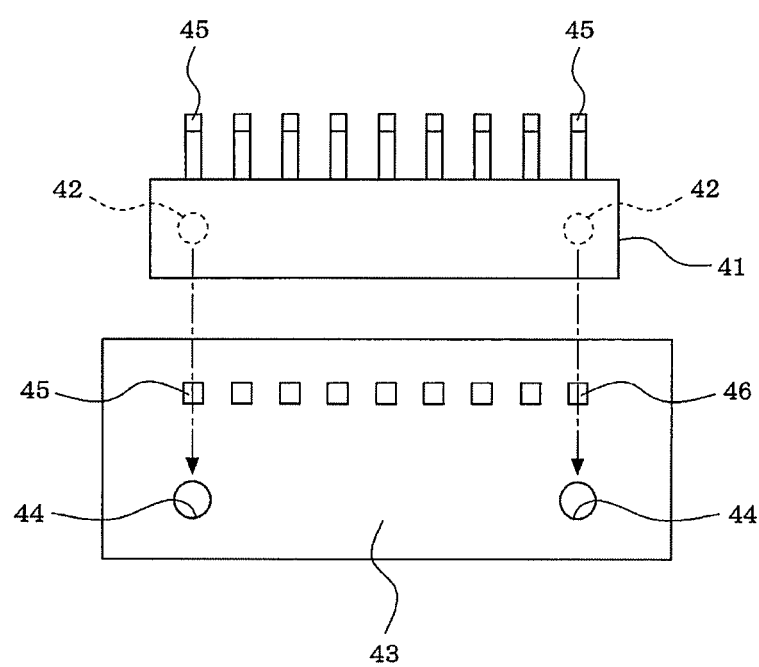
FIG. 5 shows an example configuration of a circuit board on which the insertion component is mounted.
Figure 6:
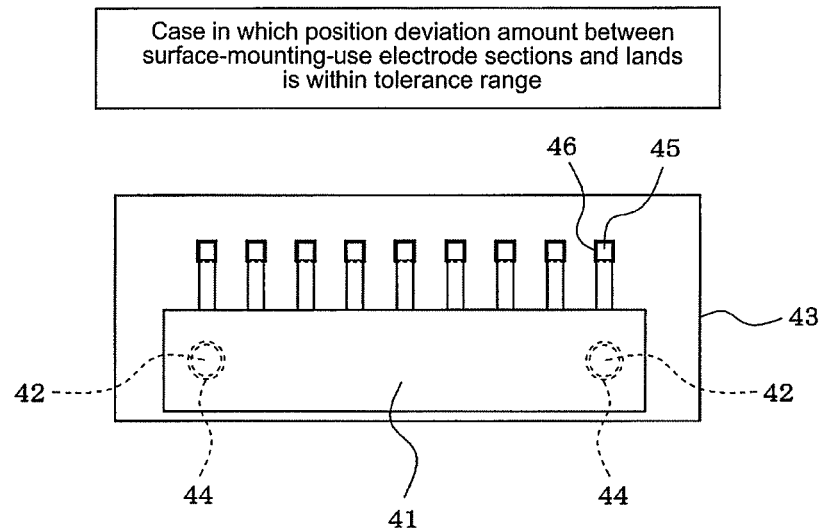
FIG. 6 is a plan view showing a mounting example in a case in which a position deviation amount between surface-mounting-use electrode sections of the insertion component and lands of the circuit board is within a tolerance amount.
Figure 7:
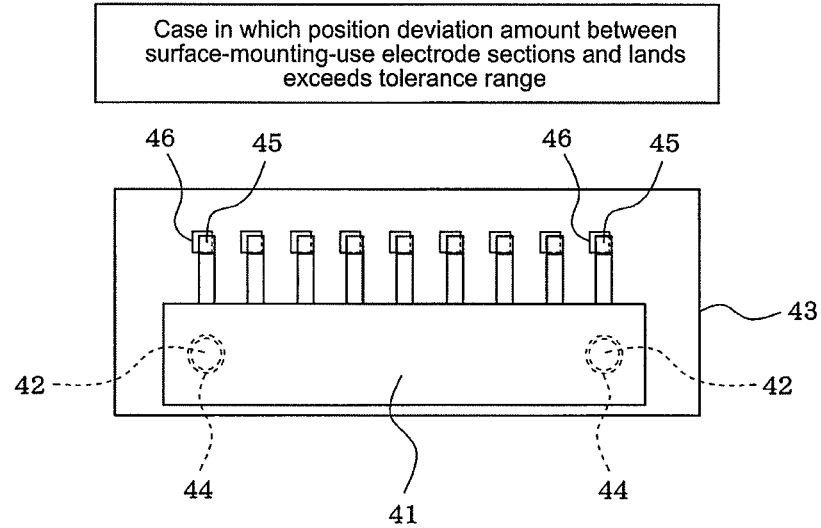
FIG. 7 is a plan view showing an example in which a position deviation amount between surface-mounting-use electrode sections of the insertion component and lands of the circuit board exceeds a tolerance amount, which will lead to a mounting defect.

Multiple component mounters 12 are exchangeably arranged adjacent in a conveyance direction of a circuit board on base 11 of the modular component mounting system. Each component mounter 12 is provided with, on main body base 13, component supply device 14 such as a tape feeder or tray feeder, conveyor 15 that conveys circuit board 43 (refer to FIGS. 5 to 7), mounting head 17 that exchangeably holds one or multiple suction nozzles 21 (refer to FIG. 2) or chucks (not shown), head moving device 22 that moves mounting head 17 in the XY directions, component imaging camera 16 that images from below the component (insertion component 41 or the like described below) held by the chuck or suction nozzle 21 of mounting head 17; also, display device 19 such as a liquid crystal display or CRT, and operation section 20 such as an operation key, a touch panel or the like, are provided on a front surface of upper section frame 18. Further, board imaging camera 23 (refer to FIG. 3) for imaging reference marks (not shown) of circuit board 43 is provided on head moving device 22 so as to move in the XY directions together with mounting head 17. Note that, only a portion of circuit board 43 to which insertion component 41 is to be mounted is shown in FIGS. 5 to 7, portions to which other electronic components are to be mounted are omitted.

Figure 1:
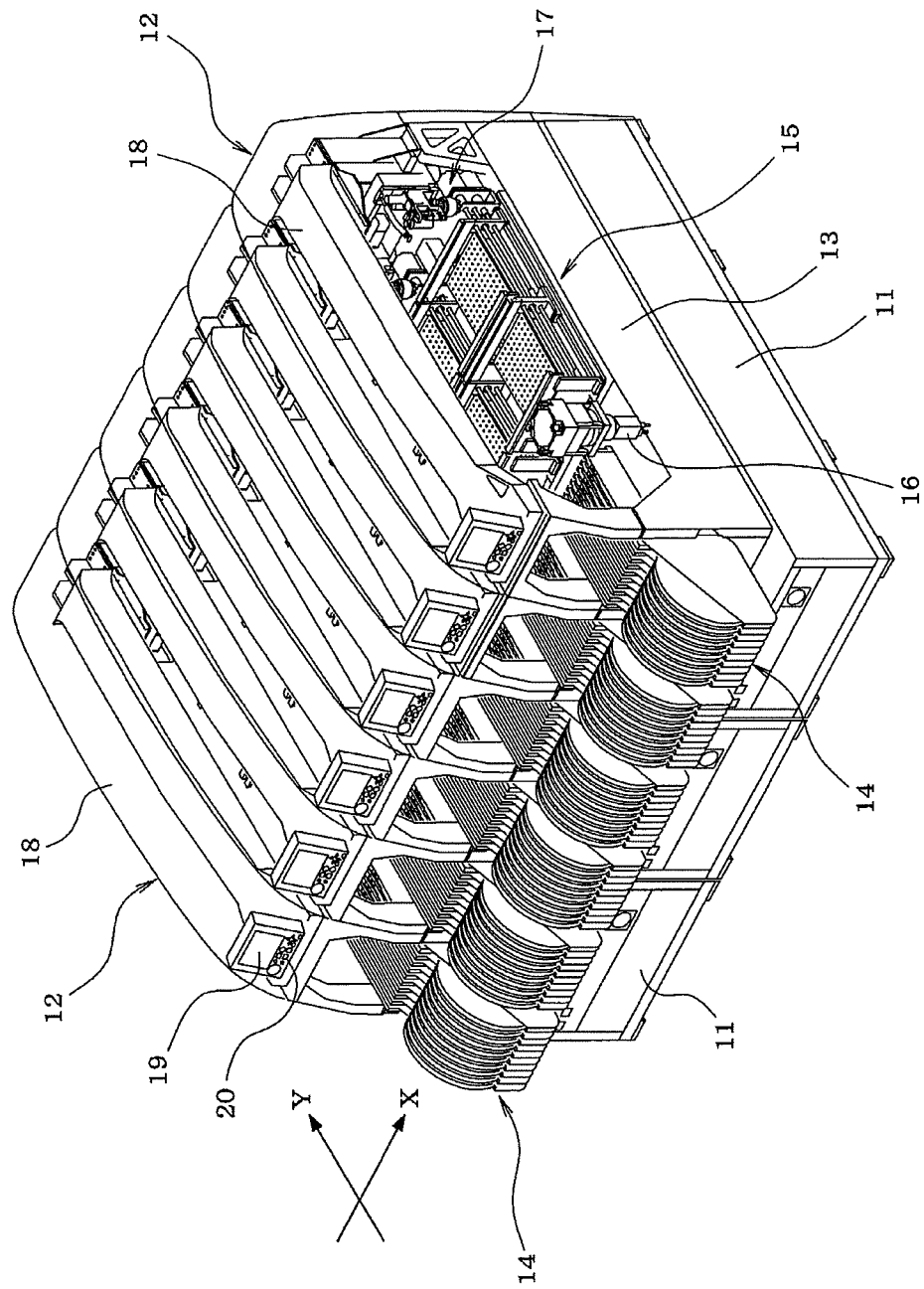
FIG. 1 is a perspective view showing the configuration of the modular component mounting system from a first embodiment of the present disclosure.
Figure 2:
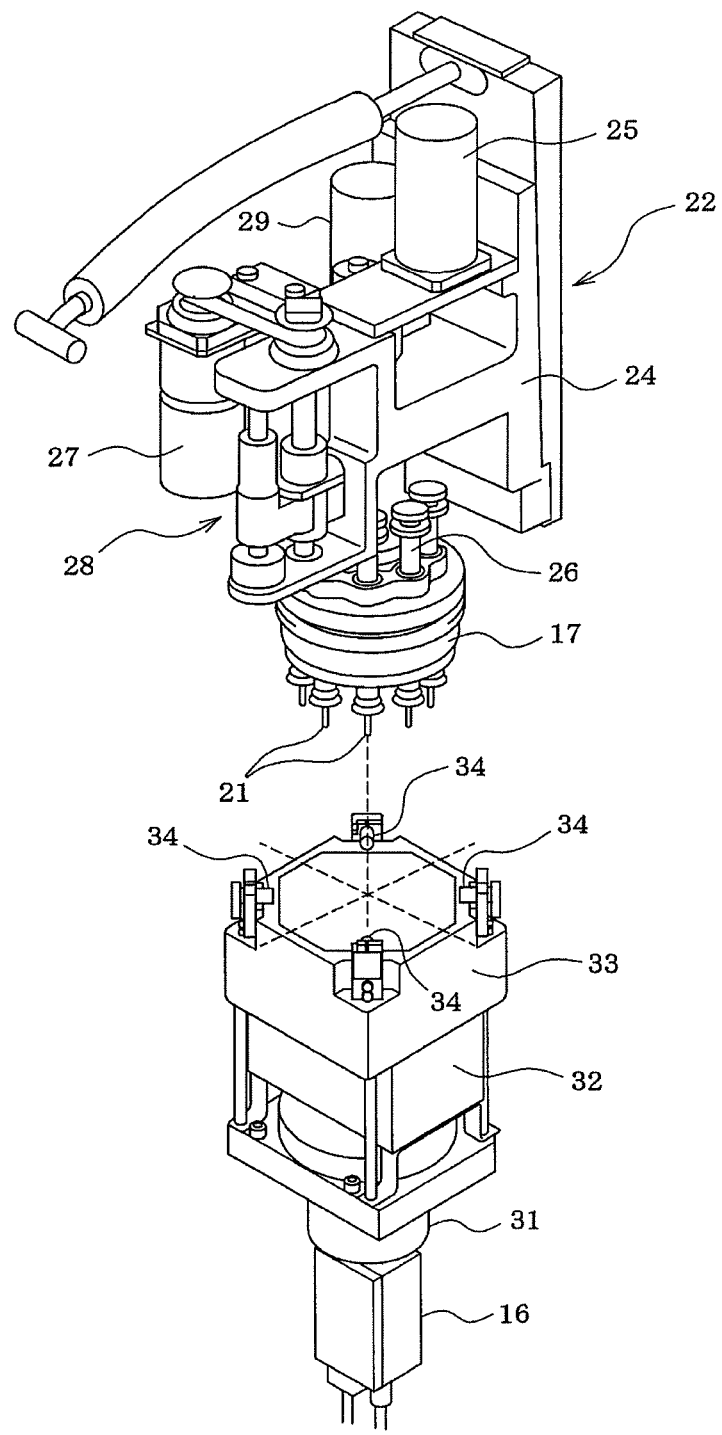
FIG. 2 is a perspective view showing the positional relationship of a mounting head, a component imaging camera, a coaxial incident illumination light source, and a side illumination laser light source.
Figure 3:
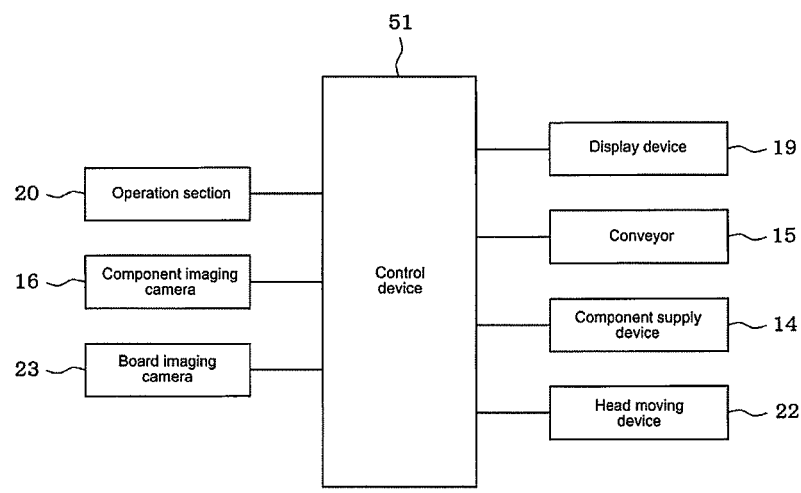
FIG. 3 is a block diagram showing the configuration of control items of the component mounter.

As shown in FIG. 2, mounting head 17 is rotatably assembled on support bracket 24 that moves in the XY directions via head moving device 22, so as to be intermittently rotated (pitch driven) each time by an arrangement pitch angle of suction nozzles 21 around a center axis of mounting head 17 via head rotating motor 25, with suction nozzles 21 being revolved together with the rotation of mounting head 17. Multiple nozzle holders 26 that hold suction nozzles 21 are assembled on mounting head 17 so as to be raised and lowered in a vertical direction (Z direction), and during component pickup operation and component mounting operation, a nozzle holder 26 (suction nozzle 21) positioned at a specified rotation position of mounting head 17 is raised and lowered by nozzle raising and lowering mechanism 28 that uses nozzle raising and lowering motor 27 as a drive source. Each suction nozzle 21 of nozzle holder 26 is configured to rotate (on its own axis) via nozzle rotation motor 29, with the angle (deviation in the rotation angle in a horizontal direction) of the component held by each suction nozzle 21 being corrected by rotating each suction nozzle 21 before performing component mounting.

On the other hand, component imaging camera 16 is arranged facing up close to the component pickup positions of component supply device 14. As shown in FIG. 2, coaxial incident illumination light source 32 is attached facing up via lens 31 to an upper side of component imaging camera 16. Coaxial incident illumination light source 32 is configured with light-emitting elements such as LEDs arranged in a circular shape coaxially with the light axis of component imaging camera 16, so as to illuminate from below a component held by suction nozzle 21 or a chuck during component imaging. Four laser light sources 34 that emit laser light in a horizontal direction towards the light axis of component imaging camera 16 are assembled on frame-shaped cover 33 of coaxial incident illumination light source 32 at 90 degree intervals.

When a component held by the chuck or suction nozzle 21 is insertion component 41 (refer to FIG. 4), which is described later, when imaging positioning-use protruding sections 42 of insertion component 41 from below using component imaging camera 16, the four laser light sources 34 are used as an illumination light source, and insertion component 41 held by the chuck or suction nozzle 21 is lowered such that the height position of the positioning-use protruding sections 42 is the same as the height position of the light axis of the laser light sources 34, and in that state laser light is emitted from the four laser light sources 34 in a horizontal direction onto the outer surface of the positioning-use protruding sections 42 of insertion component 41, and an image is captured by component imaging camera 16 including the positioning-use protruding sections 42, such that the shape of the lower end surfaces of the positioning-use protruding sections 42 can be distinguished from the lower surface of insertion component 41 in the image, and thus clearly recognized. Note that, in a case in which the lower end surfaces of positioning-use protruding sections 42 and the lower surface of insertion component 41 are different colors, and it is possible to distinguish the shape of the lower end surfaces of positioning-use protruding sections 42 and the lower surface of insertion component 41 from an image of the lower side of insertion component 41 captured using coaxial incident illumination light source 32, an image including positioning-use protruding sections 42 may be captured by illuminating insertion component 41 from below using coaxial incident illumination light source 32 and the position of positioning-use protruding sections 42 may be recognized from that image.

Each component mounter 12, after conveying a circuit board 43 conveyed from an upstream component mounter 12 to a specified position using conveyor 15 and clamping the circuit board 43 with a clamp mechanism (not shown), captures an image of reference marks of the circuit board 43 using board imaging camera 23, processes the captured image, recognizes the positions of the reference marks of the circuit board 43, picks up a component supplied by component supply device 14 using a chuck or suction nozzle 21 of mounting head 17, moves the component to the imaging position, captures an image using component imaging camera 16, performs image recognition of the pickup orientation, position deviation, and the like of the component, and mounts the component on the circuit board 43 on conveyor 15. Here, the component mounting position on circuit board 43 is determined based on the position of the reference marks of circuit board 43 using specification data (data of component mounting positions of circuit board 43 based on the positions of the reference marks) supplied from the manufacturer of the circuit board 43, and the component is mounted on the component mounting position of the circuit board 43 after correcting the position deviation and angle (deviation of the rotation angle in the horizontal direction) of the component held by the chuck or suction nozzle 21 of mounting head 17.

Figure 4:
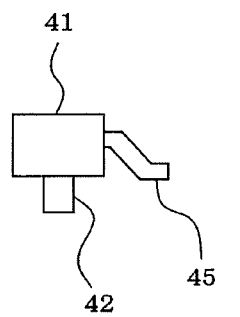
FIG. 4(a) is a front view of an insertion component.
FIG. 4(b) is a bottom view of the insertion component.
FIG. 4(c) is a left side view of the insertion component.
Figure 4:
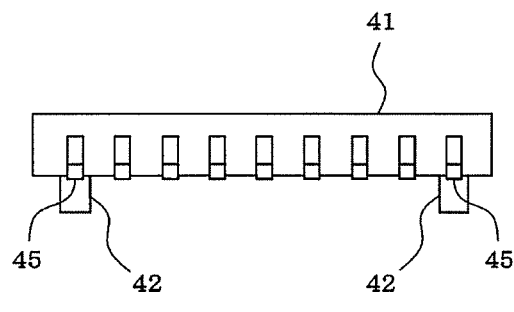
Figure 4:
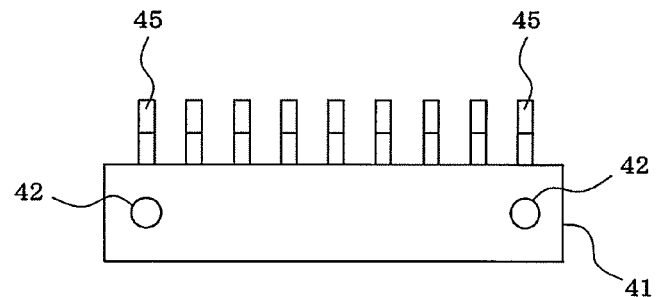

Included in the components mounted on circuit board 43 by component mounter 12 are components such as insertion component 41 shown in FIG. 4. Insertion component 41, for example, is a large component such as a connector, and with the purpose of improving the connection strength between insertion component 41 and circuit board 43 (refer to FIGS. 5 to 7), positioning-use protruding sections 42 (for example, bosses, or pins) are provided protruding downwards at multiple locations (for example, two locations) on the lower surface of insertion component 41, and positioning-use protruding sections 42 are inserted into positioning holes 44 formed at multiple locations (for example, two locations) in circuit board 43.

Generally, when using component mounter 12 to mount insertion component 41 on circuit board 43, insertion component 41 supplied by component supply device 14 such as a tray feeder is picked up by mounting head 17 of component mounter 12, and while being moved above circuit board 43, an image of insertion component 41 is captured from below by component imaging camera 16, and by processing the captured image, the position of positioning-use protruding sections 42 of insertion component 41 are recognized, and based on those results, deviation in the position and angle of insertion component 41 is corrected, and the positioning-use protruding sections 42 of insertion component 41 are inserted into positioning holes 44 of circuit board 43, such that insertion component 41 is positioned based on the multiple positioning holes 44 of circuit board 43, and surface-mounting-use electrode sections 45 (for example, tip sections of leads, or bumps) of insertion component 41 are aligned with lands 46 of circuit board 43, with reflow soldering then being performed.

However, depending on manufacturing variations of insertion components 41, or deformation of surface-mounting-use electrode sections 45 such as leads, it is possible that variance exists in the positional relationship between positioning-use protruding sections 42 of insertion component 41 and surface-mounting-use electrode sections 45, therefore, if insertion component 41 is positioned based on positioning holes 44 of circuit board 43, and surface-mounting-use electrode sections 45 of insertion component 41 are aligned with lands 46 of circuit board 43, there is a possibility surface-mounting-use electrode sections 45 may deviate in position from lands 46 of circuit board 43 depending on manufacturing variations of insertion components 41 or deformation of the surface-mounting-use electrode sections 45, and this may cause connection defects between the surface-mounting-use electrode sections 45 of insertion component 41 and lands 46 of circuit board 43, and a decrease in connection reliability.

Figure 8:
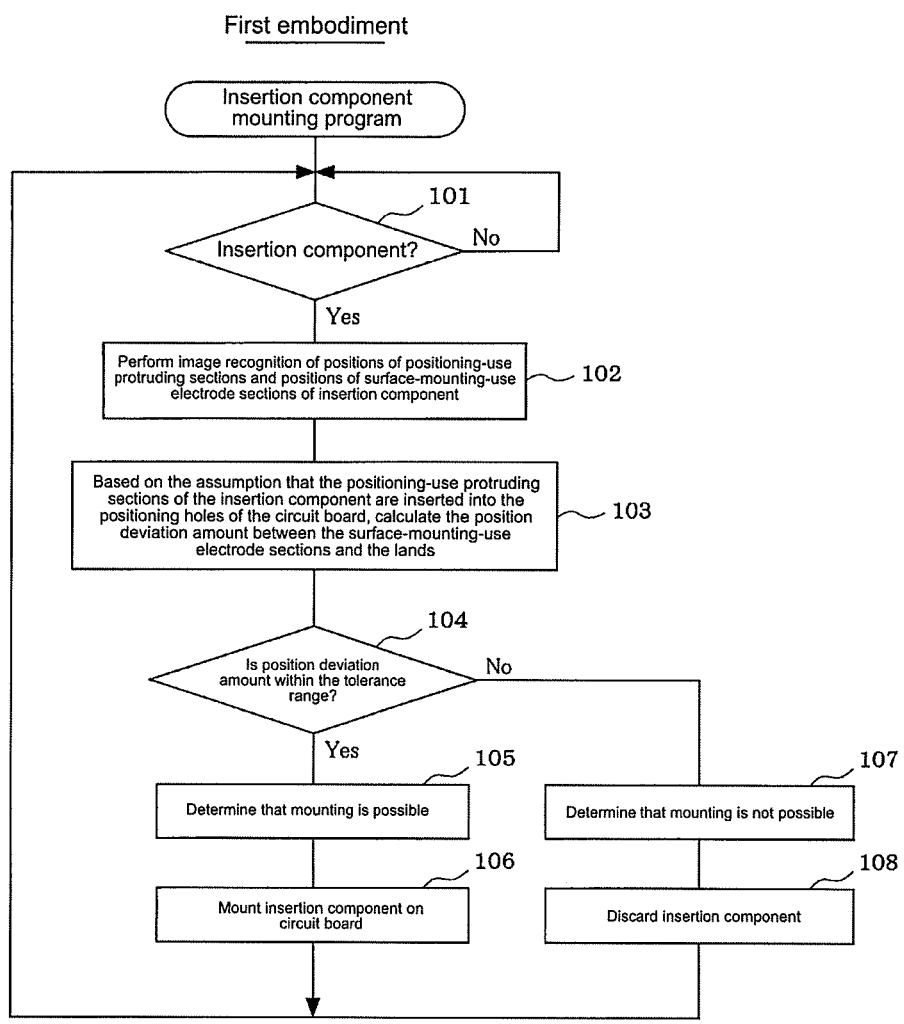
FIG. 8 is a flowchart showing a processing flow of an insertion component mounting program of a first embodiment.

Thus, in the first embodiment, control device 51 that controls operation of each mechanism of component mounter 12, by performing the insertion component mounting program of FIG. 8, functions as an insertion component positioning inspection device, and, when a component picked up by mounting head 17 is an insertion component 41, captures an image of positioning-use protruding sections 42 and surface-mounting-use electrode sections 45 of insertion component 41 either separately or simultaneously using component imaging camera 16, processes the captured image so as to function as the image processing means that recognizes the positions of the positioning-use protruding sections 42 and the positions of surface-mounting-use electrode sections 45, and, based on the assumption that positioning-use protruding sections 42 of insertion component 41 are inserted into positioning holes 44 of circuit board 43, calculates the position deviation amount between the surface-mounting-use electrode sections 45 of insertion component 41 and lands 46 of circuit board 43 so as to function as the position deviation amount calculating means, and, further, determines whether insertion component 41 can be mounted on circuit board 43 by determining whether the calculated position deviation amount is within a tolerance range so as to function as the determining means. Further, control device 51 of component mounter 12 performs control such that, in a case in which the position deviation amount between surface-mounting-use electrode sections 45 of insertion component 41 and lands 46 of circuit board 43 exceeds the tolerance range such that mounting is determined to be impossible, that insertion component 41 is discarded to a specified discard location or collection location, and only insertion components 41 for which mounting is determined to be possible are mounted on circuit board 43.

Contents of processing of the insertion component mounting program shown in FIG. 8 and performed by control device 51 of component mounter 12 are described below. This program is performed while component mounter 12 operates, and first, in step 101, it is determined whether a component picked up by a chuck or suction nozzle 21 of mounting head 17 is an insertion component 41, and if the component is not an insertion component 41, the system stands by until an insertion component 41 is picked up.

Then, when the insertion component 41 has been picked up by the chuck or suction nozzle 21 of mounting head 17, processing continues to step 102, mounting head 17 is moved above component imaging camera 16 by head moving device 22, and, when imaging positioning-use protruding sections 42 of insertion component 41 from below using component imaging camera 16, the four laser light sources 34 are used as an illumination light source, and insertion component 41 held by the chuck or suction nozzle 21 is lowered such that the height position of the positioning-use protruding sections 42 is the same as the height position of the light axis of the laser light sources 34, and in that state laser light is emitted from the four laser light sources 34 in a horizontal direction onto the outer surface of the positioning-use protrusions 42 of insertion component 41, and an image is captured by component imaging camera 16 including the positioning-use protruding sections 42, the image is processed, and the positions of positioning-use protruding sections 42 are recognized. Further, when imaging surface-mounting-use electrode sections 45 of insertion component 41 from below using component imaging camera 16, coaxial incident illumination light source 32 is used as an illumination light source, and insertion component 41 is illuminated from below by coaxial incident illumination light source 32 and an image is captured by component imaging camera 16 including surface-mounting-use electrode sections 45, the image is processed, and the positions of surface-mounting-use electrode sections 45 are recognized. Note that, in a case in which the lower end surfaces of positioning-use protruding sections 42 and the lower surface of insertion component 41 are different colors, and it is possible to distinguish the shape of the lower end surfaces of positioning-use protruding sections 42 and the lower surface of insertion component 41 from an image of the lower side of insertion component 41 captured using coaxial incident illumination light source 32, an image including both positioning-use protruding sections 42 and surface-mounting-use electrode sections 45 may be captured by illuminating insertion component 41 from below using coaxial incident illumination light source 32 and the positions of both positioning-use protruding sections 42 and the positions of surface-mounting-use electrode sections 45 may be recognized from that image.

Also, in a separate program to the main program, every time a circuit board 43 is conveyed into component mounter 12 and clamped, an image of reference marks of the circuit board 43 is captured by board imaging camera 23, the captured image is processed, and the positions of the reference marks are recognized. Image recognition of the positions of the reference marks is performed for deciding the component mounting position of circuit board 43 inside component mounter 12 before performing component mounting, therefore it is possible to use that image recognition result as is, and it is not necessary to perform additional image recognition processing.

In the above step 102, after recognizing the positions of positioning-use protruding sections 42 and the positions of surface-mounting-use electrode sections 45, continuing to step 103, based on the recognition results of the positions of positioning-use protruding sections 42 and the positions of surface-mounting-use electrode sections 45, based on the assumption that positioning-use protruding sections 42 of insertion component 41 are inserted into positioning holes 44 of circuit board 43, the position deviation amount between surface-mounting-use electrode sections 45 of insertion component 41 and lands 46 of circuit board 43 are calculated. Here, insertion component 41 is positioned such that the centers of positioning-use protruding sections 42 are aligned with the centers of positioning holes 44. Also, position data of positioning holes 44 and the positions of lands 46 of circuit board 43 are calculated from specification data (position data of positioning holes 44 and lands 46 of circuit board 43 based on the positions of the reference marks) supplied from the manufacturer of the circuit board, based on the positions of the reference marks of circuit board 43 recognized from the image of the reference marks of circuit board 43 captured in advance by board imaging camera 23.

Then, continuing to step 104, it is determined whether the position deviation amount calculated in step 103 is within a tolerance range, and if it is determined that the position deviation amount is within the tolerance range, continuing to step 105, it is determined that mounting of insertion component 41 on circuit board 43 is possible, and, continuing to step 106, insertion component 41 is mounted on circuit board 43, processing returns to step 101, and the above steps are repeated.

On the other hand, if in step 104 it is determined that the position deviation amount calculated in step 103 exceeds the tolerance range, continuing to step 107, it is determined that mounting is not possible, and, continuing to step 108, insertion component 41 is discarded in a specified discard location or collection location, processing returns to step 101, and the above steps are repeated.

According to the first embodiment described above, it is determined whether insertion component 41 can be mounted on circuit board 43 by capturing an image of positioning-use protruding sections 42 and surface-mounting-use electrode sections of insertion component 41 either separately or simultaneously using component imaging camera 16, recognizing the positions of positioning-use protruding sections 42 and the positions of surface-mounting-use electrode sections 45, and, based on the assumption that positioning-use protruding sections 42 of insertion component 41 are inserted into positioning holes 44 of circuit board 43, calculating the position deviation amount between surface-mounting-use electrode sections 45 of insertion component 41 and lands 46 of circuit board 43, and determining whether the position deviation amount is within the tolerance range; therefore, before mounting insertion component 41 on circuit board 43, it is determined whether the position deviation amount between surface-mounting-use electrode sections 45 and lands 46 is within the tolerance range when positioning-use protruding sections 42 of insertion component 41 are inserted into positioning holes 44 of circuit board 43, and mounting of insertion component 41 on circuit board 43 is only performed in cases in which the position deviation amount is within the tolerance range, thus connection defects between surface-mounting-use electrode sections 45 of insertion component 41 and lands 46 of circuit board 43 can be prevented and connection reliability improved.

Second Embodiment

Next, a second embodiment of the present disclosure will be described. However, for portions which are practically the same as the above first embodiment, the same symbols are used and explanations are omitted or abbreviated, with the sections which are largely different being described.

In the first embodiment, position data of positioning holes 44 and the positions of lands 46 of circuit board 43 are calculated from specification data (position data of positioning holes 44 and lands 46 of circuit board 43 based on the positions of the reference marks) supplied from the manufacturer of the circuit board, based on the positions of the reference marks of circuit board 43 recognized from the image of the reference marks of circuit board 43 captured in advance by board imaging camera 23; however, in the second embodiment, an image of positioning holes 44 and lands 46 of circuit board 43 is captured either separately or simultaneously by board imaging camera 23, the captured image is processed, and the positions of positioning holes 44 and lands 46 used when calculated the position deviation amount of surface-mounting-use electrode sections 45 and lands 46 are recognized.

Accordingly, even in a case in which there is variance in the positions of positioning holes 44 and lands 46 depending on manufacturing variance of circuit board 43, because the variance in the position of positioning holes 44 and the position of lands 46 can be image recognized, influence of the variance of the positions of positioning holes 44 and lands 46 can be eliminated, and it is possible to determine with good accuracy whether the position deviation amount between surface-mounting-use electrode sections 45 and lands 46 when positioning-use protruding sections 42 of insertion component 41 are inserted into positioning holes 44 of circuit board 43 is within the tolerance range.

Third Embodiment

Next, a third embodiment of the present disclosure will be described using FIG. 9. However, for portions which are practically the same as the above first and second embodiments, the same symbols are used and explanations are omitted or abbreviated, with the sections which are largely different being described.

Generally, the internal diameter of positioning holes 44 of circuit board 41 is formed with a dimension slightly larger than the external diameter of positioning-use protruding sections 42 of insertion component 41 such that the positioning-use protruding sections 42 of insertion component 41 can be easily inserted, therefore, a gap (clearance) forms between the two when positioning-use protruding sections 42 of insertion component 41 are inserted into positioning holes 44 of circuit board 41, and it is possible to shift positioning-use protruding sections 42 within the range of that gap. When ignoring the influence of this gap, in the same manner as with the first embodiment, it is fine to perform positioning of insertion component 41 such that the centers of positioning-use protruding sections 42 are aligned with the centers of positioning holes 44.

Figure 9:
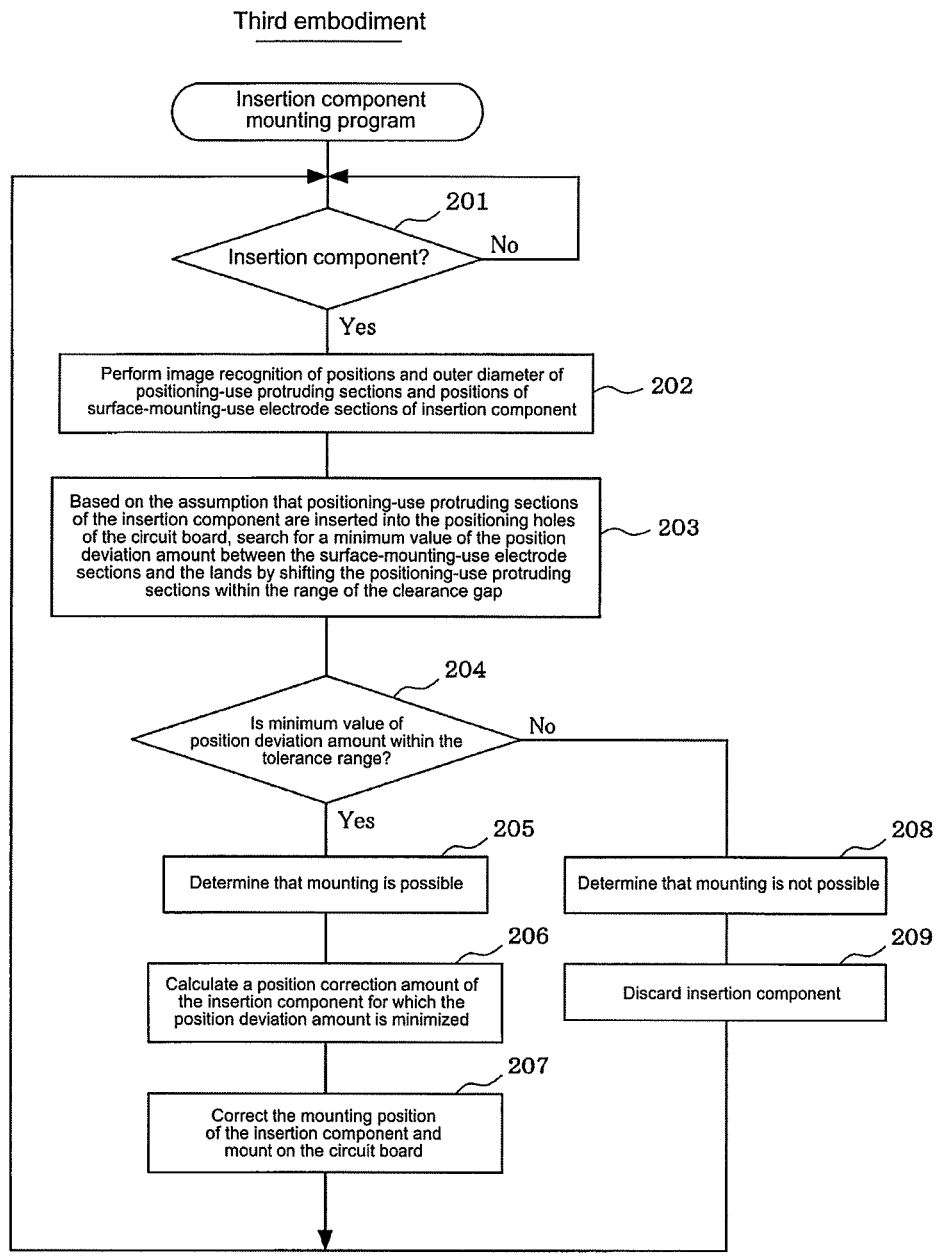
FIG. 9 is a flowchart showing a processing flow of an insertion component mounting program of a third embodiment.

With the third embodiment, considering the influence of the gap, control device 51 of component mounter 12, by performing the insertion component mounting program of FIG. 9, processes an image captured by component imaging camera 16 including positioning-use protruding sections 42 to recognize the external diameter of positioning-use protruding sections 42, and in a separate program, processes an image captured by board imaging camera 23 including positioning holes 44 to recognize the internal diameter of positioning holes 44, and based on the recognition results, based on the assumption that positioning-use protruding sections 42 of insertion component 41 are inserted into positioning holes 44 of circuit board 43, shifts positioning-use protruding sections within the range of the gap between positioning-use protruding sections 42 and positioning holes 44, searches for a minimum value of the position deviation amount between surface-mounting-use electrode sections 45 of insertion component 41 and lands 46 of circuit board 43, and determines whether mounting of insertion component 41 on circuit board 43 is possible by determining whether the minimum value of the position deviation amount is within a tolerance range; and, in a case in which it is determined that mounting is possible, calculates a position correction amount of insertion component 41 for which the position deviation amount is minimized, corrects the mounting position of insertion component 41 in accordance with the position correction amount, and mounts insertion component 41 on circuit board 43.

Contents of processing of the insertion component mounting program shown in FIG. 9 and performed by control device 51 of component mounter 12 are described below. This program is performed while component mounter 12 operates, and first, in step 201, it is determined whether a component picked up by a chuck or suction nozzle 21 of mounting head 17 is an insertion component 41, and if the component is not an insertion component 41, the system stands by until an insertion component 41 is picked up.

Then, when the insertion component 41 has been picked up by the chuck or suction nozzle 21 of mounting head 17, processing continues to step 202, mounting head 17 is moved above component imaging camera 16 by head moving device 22, and, when imaging positioning-use protruding sections 42 of insertion component 41 from below using component imaging camera 16, the four laser light sources 34 are used as an illumination light source, and insertion component 41 held by the chuck or suction nozzle 21 is lowered such that the height position of the positioning-use protruding sections 42 is the same as the height position of the light axis of the laser light sources 34, and in that state laser light is emitted from the four laser light sources 34 in a horizontal direction onto the outer surface of the positioning-use protrusions 42 of insertion component 41, and an image is captured by component imaging camera 16 including the positioning-use protruding sections 42, and the positions and diameters of positioning-use protruding sections 42 are recognized. Further, the lower surface of insertion component 41 is illuminated by coaxial incident illumination light source 32, an image including surface-mounting-use electrode sections 45 is captured by component imaging camera 16, and the positions of surface-mounting-use electrode sections 45 are recognized.

Also, in a separate program to the main program, every time a circuit board 43 is conveyed into component mounter 12 and clamped, an image of reference marks of the circuit board 43 is captured by board imaging camera 23, and the positions of the reference marks are recognized, and an image including positioning holes 44 is captured by board imaging camera 23, and the internal diameters of positioning holes 44 are recognized. Here, an image of the reference marks and positioning holes 44 of circuit board 43 may be captured by board imaging camera 23 simultaneously or separately. Also, position data of lands 46 of circuit board 43, in the same manner as the first embodiment, may be calculated from specification data provided by the manufacturer of circuit board 43, or, in the same manner as the second embodiment, may be recognized by capturing an image using board imaging camera 23.

In the above step 202, after recognizing the positions and external diameter of positioning-use protruding sections 42 and the positions of surface-mounting-use electrode sections 45, continuing to step 203, based on the recognition results of the positions and diameters of positioning-use protruding sections 42 and the positions of surface-mounting-use electrode sections 45, based on the assumption that positioning-use protruding sections 42 of insertion component 41 are inserted into positioning holes 44 of circuit board 43, a minimum value of the position deviation amount between surface-mounting-use electrode sections 45 of insertion component 41 and lands 46 of circuit board 43 is searched for by shifting positioning-use protruding sections 42 within the range of the gap between positioning-use protruding sections 42 and positioning holes 44.

Then, continuing to step 204, it is determined whether the searched minimum value of the position deviation amount is within a tolerance range, and if it is determined that the minimum value of the position deviation amount is within the tolerance range, continuing to step 205, it is determined that insertion component 41 can be mounted on circuit board 43. In this case, in step 206, after calculating the position correction amount of insertion component 41 for which the position deviation amount is minimized, continuing to step 207, the mounting position of insertion component 41 is corrected in accordance with the position correction amount of insertion component 41, insertion component 41 is mounted on circuit board 43, processing returns to step 201, and the above steps are repeated.

On the other hand, if in step 204 it is determined that the searched minimum value of the position deviation amount exceeds the tolerance range, continuing to step 208, it is determined that mounting is not possible, and, continuing to step 209, insertion component 41 is discarded in a specified discard location or collection location, processing returns to step 201, and the above steps are repeated.

According to the third embodiment described above, based on the assumption that positioning-use protruding sections 42 are inserted into positioning holes 44 of circuit board 43, a minimum value of the position deviation amount between surface-mounting-use electrode sections 45 of insertion component 41 and lands 46 of circuit board 43 is searched for by shifting positioning-use protruding sections 42 within a range of the gap between positioning-use protruding sections 42 and positioning holes 44, and whether insertion component 41 can be mounted on circuit board 43 is determined by determining whether the minimum value of the position deviation amount is within a tolerance range; therefore, the gap between positioning-use protruding sections 42 and positioning holes 44 is used effectively to minimize the position deviation amount between surface-mounting-use electrode sections 45 of insertion component 41 and lands 46 of circuit board 43, and it is possible to determine whether insertion component 41 can be mounted on circuit board 43 by determining whether the minimum value of the position deviation amount is within a tolerance range, and to determine with high accuracy taking into account the gap between positioning-use protruding sections 42 and positioning holes 44. Further, if mounting is determined to be possible, because a position correction amount of insertion component 41 for which the position deviation amount between surface-mounting-use electrode sections 45 and lands 46 is minimized is calculated, when mounting insertion component 41 on circuit board 43, it is possible to mount insertion component 41 on circuit board 43 minimizing the position deviation amount between surface-mounting-use electrode sections 45 and lands 46, thus improving the connection reliability between surface-mounting-use electrode sections 45 and lands 46.

Note that, the disclosure is not limited to the above-mentioned first to third embodiments, and it goes without saying that various changes may applied without departing from the scope of the disclosure, for example, the configuration of component mounter 12 or the configuration of insertion component 41 or circuit board 43 may be appropriately modified.

REFERENCE SIGNS LIST

12: component mounter; 14: component supply device; 15: conveyor; 16: component imaging camera; 17: mounting head; 21: suction nozzle; 22: head moving device; 23: board imaging camera; 32: coaxial incident illumination light source; 34: laser light source; 41: insertion component; 42: positioning-use protruding section; 43: circuit board; 44: positioning hole; 45: surface-mounting-use electrode section; 46: land; 51: control device (image processing means, position deviation amount calculating means, inspection means)

The invention claimed is:

1. An insertion component positioning inspection method for determining whether an insertion component provided with a positioning-use protruding section and a surface-mounting-use electrode section can be inserted into a circuit board provided with a positioning hole into which the positioning-use protruding section is inserted and a land for connecting to the surface-mounting-use electrode section, the insertion component positioning inspection method comprising:
capturing an image of the positioning-use protruding section and the surface-mounting-use electrode section of the insertion component either separately or simultaneously using a component imaging camera;
processing the captured image to recognize positions of the positioning-use protruding section and the surface-mounting-use electrode section;
calculating a position deviation amount between the surface-mounting-use electrode section of the insertion component and the land of the circuit board based on the recognized positions of the positioning-use protruding section and the surface-mounting-use electrode section at an assumed condition in which the positioning-use protruding section of the insertion component is inserted into the positioning hole of the circuit board such that a center of the positioning-use protruding section of the insertion component is aligned with a center of the positioning hole of the circuit board; and
determining whether the insertion component can be mounted on the circuit board by determining whether the position deviation amount is within a tolerance range.

2. The insertion component positioning inspection method according to claim 1, wherein
when calculating the position deviation amount, specification data provided by a manufacturer of the circuit board is used as data of the position of the positioning hole and the position of the land of the circuit board.

3. The insertion component positioning inspection method according to claim 1, wherein
the position of the positioning hole and the position of the land used when calculating the position deviation amount are recognized by processing the image captured by the board imaging camera either separately or simultaneously of the positioning hole and the land of the circuit board.

4. The insertion component positioning inspection method according to claim 3, wherein
an external diameter of the positioning-use protruding section is recognized by processing the image captured by the component imaging camera including the positioning-use protruding section,
an internal diameter of the positioning hole is recognized by processing the image captured by the board imaging camera including the positioning hole, and,
based on the recognition results of the external diameter of the positioning-use protruding section and the internal diameter of the positioning hole, based on an assumption that the positioning-use protruding section of the insertion component is inserted into the positioning hole of the circuit board, the following actions are performed: searching for a minimum value of the position deviation amount between the surface-mounting-use electrode section and the land of the circuit board by shifting the positioning-use protruding section within a range of a distance between the positioning-use protruding section and the positioning hole, determining whether the insertion component can be mounted on the circuit board by determining whether the minimum value of the position deviation amount is within a tolerance range, and in a case of determining that mounting is possible, calculating a position correction amount of the insertion component for which the position deviation amount is the minimum value.

5. An insertion component mounting method comprising:
in a state with an insertion component being held by a mounting head of a component mounter, determining whether the insertion component can be mounted on a circuit board using the insertion component positioning inspection method according to claim 1;

discarding the insertion component for which mounting is determined to be impossible to a specified discard location or collection location; and mounting the insertion component for which mounting is determined to be possible on the circuit board.

6. An insertion component mounting method comprising:
in a state with an insertion component being held by a mounting head of a component mounter, determining whether the insertion component can be mounted on a circuit board using the insertion component positioning inspection method according to claim 4;

discarding the insertion component for which mounting is determined to be impossible to a specified discard location or collection location; and mounting the insertion component for which mounting is determined to be possible on the circuit board after correcting a mounting position of the component by the position correction amount.

7. An insertion component positioning inspection device for determining whether an insertion component provided with a positioning-use protruding section and a surface-mounting-use electrode section can be inserted into a circuit board provided with a positioning hole into which the positioning-use protruding section is inserted and a land for connecting to the surface-mounting-use electrode section, the insertion component positioning inspection device comprising:

a component imaging camera configured to capture an image of the positioning-use protruding section and the surface-mounting-use electrode section of the insertion component either separately or simultaneously;

an image processing means configured to process the captured image to recognize positions of the positioning-use protruding section and the surface-mounting-use electrode section;

a position deviation amount calculating means configured to calculate a position deviation amount between the surface-mounting-use electrode section of the insertion component and the land of the circuit board based on a processing result of the image processing means at an assumed condition in which the positioning-use protruding section of the insertion component is inserted into the positioning hole of the circuit board such that a center of the positioning-use protruding section of the insertion component is aligned with a center of the positioning hole of the circuit board; and a determining means configured to determine whether the insertion component can be mounted on the circuit board by determining whether the position deviation amount calculated by the position deviation calculating means is within a tolerance range.

8. An insertion component mounting device comprising:
an insertion component positioning inspection device according to claim 7, wherein the insertion component mounting device, in a state with an insertion component being held by a mounting head of a component mounter, determines whether the insertion component can be mounted on a circuit board using the insertion component positioning inspection device, discards the insertion component for which mounting is determined to be impossible to a specified discard location or collection location; and mounts the insertion component for which mounting is determined to be possible on the circuit board.

9. An insertion component positioning inspection device for determining whether an insertion component provided with a positioning-use protruding section and a surface-mounting-use electrode section can be inserted into a circuit board provided with a positioning hole into which the positioning-use protruding section is inserted and a land for connecting to the surface-mounting-use electrode section, the insertion component positioning inspection device comprising:

a component imaging camera configured to capture an image of the positioning-use protruding section and the surface-mounting-use electrode section of the insertion component either separately or simultaneously; and circuitry configured to
process the captured image to recognize positions of the positioning-use protruding section and the surface-mounting-use electrode section;

calculate a position deviation amount between the surface-mounting-use electrode section of the insertion component and the land of the circuit board based on a processing result of the image processing means at an assumed condition in which the positioning-use protruding section of the insertion component is inserted into the positioning hole of the circuit board such that a center of the positioning-use protruding section of the insertion component is aligned with a center of the positioning hole of the circuit board; and determine whether the insertion component can be mounted on the circuit board by determining whether the position deviation amount calculated by the position deviation calculating means is within a tolerance range.

\* \* \* \* \*